United States Patent [19]

[11] 4,034,127

Busanovich et al.

[45] July 5, 1977

[54] METHOD OF FORMING AND TREATING CADMIUM SELENIDE PHOTOCONDUCTIVE BODIES

[75] Inventors: Charles John Busanovich, Princeton, N.J.; Robert Milton Moore, Carmel, Ind.

[73] Assignee: RCA Corporation, New York, N.Y.

[22] Filed: Mar. 31, 1975

[21] Appl. No.: 563,682

[52] U.S. Cl. ................................ 427/76; 427/380; 96/1.5; 427/294; 427/377; 423/508; 29/572

[51] Int. Cl.[2] ........................................ H01L 21/363

[58] Field of Search ................ 427/87, 91, 76, 377, 427/380; 423/508, 509; 96/1.5

[56] References Cited

UNITED STATES PATENTS 2,575,392 11/1951 Peters et al. ........................ 427/76
3,466,183 9/1969 Kiuchi et al. ........................ 427/76
3,948,656 3/1976 Maxwell ............................... 96/1.5

FOREIGN PATENTS OR APPLICATIONS 4,538,666 7/1967 Japan ................................ 427/76

OTHER PUBLICATIONS

Yamaguchi et al., Japan J. Appl. Phys., vol. 13 (1974), No. 11, pp. 1897-1898.

*Primary Examiner*—John D. Welsh
*Attorney, Agent, or Firm*—Glenn H. Bruestle; Dennis H. Irlbeck; William L. Muckelroy

[57] ABSTRACT

A cadmium selenide base layer is vapor deposited on a substrate and thermally treated to achieve a desired photosensitivity, crystallographic structure, and granularity.

10 Claims, 2 Drawing Figures

METHOD OF FORMING AND TREATING CADMIUM SELENIDE PHOTOCONDUCTIVE BODIES

BACKGROUND OF THE INVENTION

This invention relates to cadmium selenide photoconductive devices, and more particularly to methods of fabricating photoconductive cadmium selenide bodies for such devices.

Cadmium selenide photoconductive bodies having high photosensitivities across the entire visible light spectrum from 400 to 700 nm. are desired for use in light sensitive devices such as photodiodes and imaging devices. Furthermore, methods of fabricating such bodies are particularly desired wherein the photoconductive cadmium selenide material additionally has a crystallographic structure and granularity having a minimum of non-uniformities and defects which could otherwise cause non-uniform light sensitivities of such devices along their light sensitive input surfaces.

SUMMARY OF THE INVENTION

A method for fabricating a cadmium selenide photoconductive body is disclosed wherein an overlayer of cadmium selenide is formed on a substrate and thereafter thermally treated in various atmospheres for improving photosensitivity of the body to light within the visible spectrum.

DESCRIPTION OF THE PREFERRED EMBODIMENTS

Figure 1:
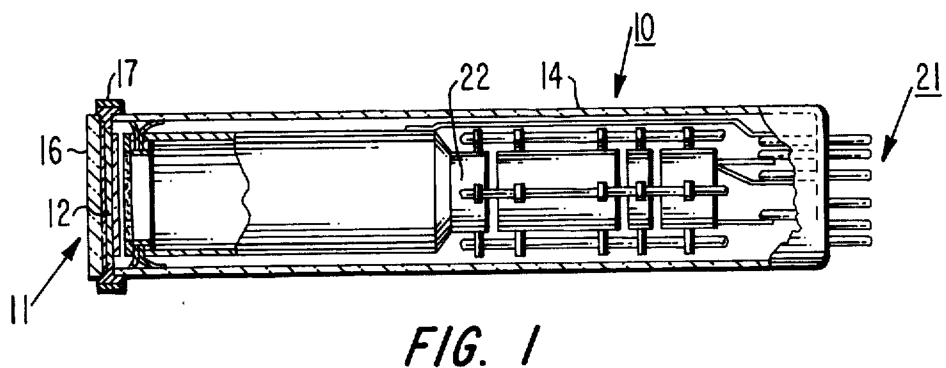
FIG. 1 is a cross-sectional view of a vidicon-type camera tube including a photoconductive body fabricated in accordance with the invention.

Referring to FIG. 1, there is shown a camera tube 10 wherein a target 11, which includes a photoconductive body 12, is mounted at one end of an evacuated elongated tubular envelope 14. A transparent faceplate 16 is hermetically sealed to the target end of the envelope 14 by means of a conductive sealant ring 17.

Figure 2:
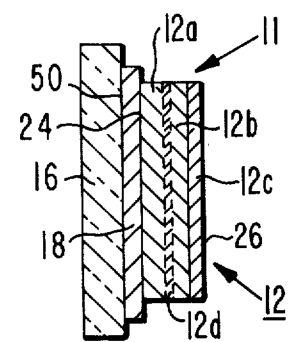
FIG. 2 is a greatly exaggerated cross-sectional view of the target of the tube depicted in FIG. 1.

Referring to FIG. 2, the target 11 is shown in exaggerated detail. The target 11 includes: a transparent conductive coating 18 which is formed along an inner surface 20 of the faceplate 16, and the photoconductive body 12 which is fabricated along a major surface of coating 18 opposite to the surface in contact with the faceplate 16. The conductive sealant ring 17 makes electrical contact to the coating 18 within the tube 10 and provides, together with an electron beam forming and scanning means 22 (FIG. 1), a means externally applying an electrical potential across opposed surfaces 24 and 26 of the body 12. The electron beam forming and scanning means 22 includes necessary electrodes, fixably mounted and secured within the elongated interior of the envelope 14, for producing and scanning an electron beam along a path across the exposed major surface 26 of the body 12. A plurality of electrical lead-in pins 21 are hermetically sealed through a stem portion of an end of envelope 14 opposite to the target 11. The pins 21 are electrically interconnected to respective ones of the electrodes internally within the envelope 14 in a manner well known in the art. During the operation of the vidicon 10, suitable voltages are applied to the lead-in pins 21 and the ring 17 in a manner well known in the art.

The photoconductive body 12 may, for example, comprise numerous layers. For example, in the preferred construction of the target 11, the body 12 comprises in a direction of thickness progressing from the major surface 24 to the other opposed scanned major surface 26: (1) a first material region 12*a* primarily of n-type electrical conductivity cadmium selenide; (2) a second material region 12*b* consisting essentially of an insulating overlayer on the first material region; and (3) a third material region 12*c* of a high resistance compound having a resistivity exceeding $10^8$ ohm-cm. A thin transition material region 12*d* is located at the "interface region" between the second material region 12*b* and the first material 12*a*. A blocking contact is also provided within the transition region 12*d* and/or second material region 12*b*.

The photoconductive body 12 may be fabricated on a transparent conductive coating 18 which has been previously deposited on the major surface 20 of the faceplate 16 as shown in FIG. 2. The transparent conductive coating 18 may, for example, comprise a tin oxide material, $SnO_2$, which is deposited on the faceplate 16 in a manner well known in the art.

As a first step in the fabrication of a photoconductive body 12 for a vidicon-type camera tube, a 1 to 2 micron thick overlayer of cadmium selenide is vapor deposited in a vacuum of preferably less than $10^{-5}$ torr on the exposed major suface of the transparent conductive coating 18 (i.e. the "substrate"), while maintaining the substrate at a temperature within the range of from about 200° C. to about 500° C. The substrate is preferably maintained at a temperature within the range of from about 225° C. to about 350° C.

The faceplate or substrate 16 which includes the cadmium selenide overlayer (i.e. the "workpiece") is thermally treated or baked at a temperature within the range of from about 450° C. to about 550° C. within a continuously renewed atmosphere substantially of an inert gas selected from the group consisting of argon, helium, and nitrogen, or mixtures thereof, for a period of time in excess of about 2 hours. The thermal treatment or baking of the workpiece is preferably accomplished at a temperature of about 500° C. in an atmosphere substantially of argon for a period of time of approximately 16 hours.

During the previously described baking operation, the atmosphere is preferably renewed in the region proximate to the cadmium selenide overlayer at a rate sufficient to provide an atmospheric stream proximate to the exposed surface of the workpiece having a speed of from about 1 to about 10 cm. per minute.

The workpiece is subjected to a second thermal treatment or baking operation at a temperature within the range of from about 250° C. to about 450° C. in air for a period of time of from about 15 minutes to about 2 hours. The second thermal treatment or baking is preferably at a temperature of about 400° C. and is continued for a period of approximately 30 minutes.

By employing the previously described process for the formation of the cadmium selenide overlayer 12*a*, a form of cadmium selenide is fabricated on the transparent conductive coating 18 which is primarily polycrystalline and includes crystallites of multiple crystallographic phases. Generally, the cadmium selenide crystallites formed by the method comprise the bulk of the cadmium selenide overlayer and have a substantially uniform cross-sectional dimension (i.e. diameter or width) of preferably less than 3 microns along a plane parallel to the major surface 24 of the faceplate 16 in contact with that overlayer; however cross-sectional dimensions approaching 20 microns may be employed to advantage.

In the preferred method, highly oriented hexagonal crystallites are formed wherein the corresponding dimensions or widths of the crystallites average between 1 and 7 microns in width. Such photoconductive bodies are particularly useful for light sensitive imaging devices.

By employing the previously described process, a first material region 12*a*, of n-type electrically conductive cadmium selenide is fabricated which is highly photosensitive (i.e. has a high quantum efficiency) across the entire visible spectrum from 400 nm. to 700 nm. and includes a substantially uniform granularity and surface appearance particularly suited to the continued fabrication of the transition material region 12*d* and the additional overlayers 12*b* and 12*c* which may be necessary for the desired operation of the preferred photosensitive device herein described. The heat treatment herein disclosed increases both the resistivity of the photoconductive body 12 in the dark (i.e. non-illuminated) and the signal current contrast ratio between illuminated and non-illuminated regions of the body 12. While the method of forming and treating photoconductive cadmium selenide body herein disclosed may be employed to considerable advantage in camera tubes, such as described, the method may also be used to considerable advantage in fabricating other light sensitive devices such as photodiodes and electrophotographic plates.

We claim:

1. A method for fabricating a photoconductive body on a surface of a substrate including the steps of:

a. vapor depositing within an evacuated chamber an overlayer of cadmium selenide on the surface of the substrate while maintaining the substrate at a temperature of from about 200° C. to about 500° C.; then b. thermally treating the substrate including the cadmium selenide overlayer at a temperature of from about 450° C. to about 550° C. within a continuously renewed atmosphere substantially of an inert gas selected from the group consisting of argon, helium, and nitrogen, or mixtures thereof, for a period of time of at least 2 hours; and, thereafter c. thermally treating the substrate including the cadmium selenide overlayer in air at a temperature of from about 250° C. to about 450° C. for a period of time from about 15 minutes to about 2 hours.

2. The method of claim 1, wherein said vapor depositing step is accomplished in a vacuum chamber with a pressure less than about $10^{-5}$ torr.

3. The method of claim 1, wherein the temperature of said substrate while vapor depositing cadmium selenide is from about 225° C. to about 350° C.

4. The method of claim 1, wherein the atmosphere of step *b* is renewed at a rate of from about 1 to about 10 centimeters per minute in the atmosphere region proximate to the cadmium selenide overlayer on said substrate.

5. The method of claim 4, wherein the atmosphere of step *b* consists essentially of argon.

6. The method of claim 5, wherein the thermal treatment of step *b* is accomplished at a temperature of about 500° C.

7. The method of claim 6, wherein the thermal treatment of step *b* is for a period of time of approximately 16 hours.

8. The method of claim 1, wherein the thermal treatment of step *c* is a temperature of about 400° C.

9. The method of claim 8, wherein the thermal treatment of step *c* is for a period of time of approximately 30 minutes.

10. A method for fabricating a photoconductive body on a surface of a substrate including the steps of:

a. forming an overlayer of cadmium selenide on the surface of the substrate, then b. thermally treating the substrate including the cadmium selenide overlayer at a temperature of from about 450° C. to about 550° C. within a continuously renewed atmosphere substantially of an inert gas selected from the gorup consisting of argon, helium, and nitrogen, or mixtures thereof, for a period of time of at least 2 hours; and, thereafter c. thermally treating the substrate including the cadmium selenide overlayer in air at a temperature of from about 250° C. to about 450° C. for a period of time from about 15 minutes to about 2 hours.

* * * * *